US008817822B1

(12) United States Patent
Reichert et al.

(10) Patent No.: US 8,817,822 B1
(45) Date of Patent: Aug. 26, 2014

(54) MINIMIZING INTERFERENCE BETWEEN MULTIPLE SIGNALS OVER A WIDE BANDWIDTH

(75) Inventors: Charles H. Reichert, Hiawatha, IA (US); Chenggang Xie, Marion, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 379 days.

(21) Appl. No.: 13/010,186

(22) Filed: Jan. 20, 2011

(51) Int. Cl.
*H04J 1/00* (2006.01)

(52) U.S. Cl.
USPC .......................................... 370/480; 370/464

(58) Field of Classification Search
None
See application file for complete search history.

(56) References Cited

U.S. PATENT DOCUMENTS

| 2005/0058212 | A1* | 3/2005 | Shao ............................. 375/260 |
| 2007/0110180 | A1* | 5/2007 | Hammerschmidt et al. ... 375/267 |
| 2007/0147479 | A1* | 6/2007 | Yamasuge ..................... 375/131 |
| 2007/0211641 | A1* | 9/2007 | Fu et al. ......................... 370/241 |
| 2007/0230328 | A1* | 10/2007 | Saitou ............................ 370/210 |
| 2008/0123514 | A1* | 5/2008 | Geile et al. .................... 370/203 |
| 2008/0225820 | A1* | 9/2008 | Atarashi et al. ............... 370/342 |
| 2009/0109948 | A1* | 4/2009 | Bauernfeind ................. 370/343 |
| 2010/0278283 | A1* | 11/2010 | Sandhu ......................... 375/298 |
| 2010/0285769 | A1* | 11/2010 | Conroy et al. ................ 455/318 |
| 2011/0064175 | A1* | 3/2011 | Leyonhjelm et al. ......... 375/350 |
| 2011/0210787 | A1* | 9/2011 | Lee et al. ...................... 330/126 |

* cited by examiner

*Primary Examiner* — Hassan Kizou
*Assistant Examiner* — Deepa Belur
(74) *Attorney, Agent, or Firm* — Donna P. Suchy; Daniel M. Barbieri

(57) ABSTRACT

A device may include a first antenna and a second antenna. The device may further include a frequency domain multiplexer configured for receiving a first input signal. The frequency domain multiplexer may have a first output port connected to the first antenna and configured for supplying a signal in a low band frequency range of the first input signal to the first antenna, and a second output port connected to the second antenna and configured for supplying a signal in a high band frequency range of the first input signal to the second antenna. The device may also include a third antenna configured for receiving a signal in a mid band frequency range of a second input signal. The low band frequency range may be separated from the high band frequency range.

20 Claims, 6 Drawing Sheets

MINIMIZING INTERFERENCE BETWEEN MULTIPLE SIGNALS OVER A WIDE BANDWIDTH

TECHNICAL FIELD

The present disclosure generally relates to the field of signal power amplification, and more particularly to a device, system, and method of power amplification for wideband multiple signals.

BACKGROUND

When transmitting wideband multiple signals, it may be necessary to utilize separate RF power amplifier circuits and antennas to transmit multiple signals, where each signal has a single frequency band. For example, this separation may be necessary to avoid cross talk between adjacent frequency bands. Thus, wideband multiple signals may be generated by supplying various single amplified signals. However, each power amplifier circuit may typically require a separate final stage amplifier, driver, filter, and directional coupler as well, which may add to the overall size, weight, and/or cost of such a system. Further, the utilization of multiple final stage amplifiers paired with multiple directional couplers may also increase overall power dissipation from the system, which may weaken the resulting signal.

SUMMARY

A device may include a first signal receiving element. The device may also include a second signal receiving element. The device may further include a frequency domain multiplexer having an input port for receiving a first input signal having a low band frequency range including a first lower cutoff frequency and a first upper cutoff frequency. The first input signal may also have a high band frequency range including a second lower cutoff frequency and a second upper cutoff frequency. The frequency domain multiplexer may also have a first output port connected to the first signal receiving element and configured for supplying a signal in the low band frequency range of the first input signal to the first signal receiving element, and a second output port connected to the second signal receiving element and configured for supplying a signal in the high band frequency range of the first input signal to the second signal receiving element. The device may also include a third signal receiving element configured for receiving a signal in a mid band frequency range of a second input signal. The mid band frequency range may include a third lower cutoff frequency and a third upper cutoff frequency. In embodiments, at least one of the first upper cutoff frequency of the low band frequency range is greater than the third lower cutoff frequency of the mid band frequency range or the second lower cutoff frequency of the high band frequency range is less than the third upper cutoff frequency of the mid band frequency range.

A method for providing amplified multiple output signals is described in accordance with the present disclosure. The method may include receiving a first input signal. The first input signal may have a low band frequency range including a first lower cutoff frequency and a first upper cutoff frequency, as well as a high band frequency range including a second lower cutoff frequency and a second upper cutoff frequency. The method may also include separating the low band frequency range of the first input signal from the high band frequency range of the first input signal. The method may further include supplying a signal in the separated low band frequency range of the first input signal to a signal path. The method may also include supplying a signal in the separated high band frequency range of the first input signal to a signal path. The method may further include supplying a signal in a mid band frequency range of a second input signal to a signal path. The mid band frequency range may include a third lower cutoff frequency and a third upper cutoff frequency. In embodiments, at least one of the first upper cutoff frequency of the low band frequency range is greater than the third lower cutoff frequency of the mid band frequency range or the second lower cutoff frequency of the high band frequency range is less than the third upper cutoff frequency of the mid band frequency range.

A system may include a first signal receiving element. The system may also include a second signal receiving element. The system may further include a frequency domain multiplexer having an input port for receiving a first input signal having a low band frequency range including a first lower cutoff frequency and a first upper cutoff frequency. The first input signal may also have a high band frequency range including a second lower cutoff frequency and a second upper cutoff frequency. The frequency domain multiplexer may also have a first output port connected to the first signal receiving element and configured for supplying a signal in the low band frequency range of the first input signal to the first signal receiving element, and a second output port connected to the second signal receiving element and configured for supplying a signal in the high band frequency range of the first input signal to the second signal receiving element. The system may also include a first amplifier for providing the first signal to the frequency domain multiplexer. The system may further include a third signal receiving element configured for receiving a signal in a mid band frequency range of a second input signal. The mid band frequency range may include a third lower cutoff frequency and a third upper cutoff frequency. In embodiments, at least one of the first upper cutoff frequency of the low band frequency range is greater than the third lower cutoff frequency of the mid band frequency range or the second lower cutoff frequency of the high band frequency range is less than the third upper cutoff frequency of the mid band frequency range. The system may further include a second amplifier for providing the second signal to the third signal receiving element.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Figure 1:
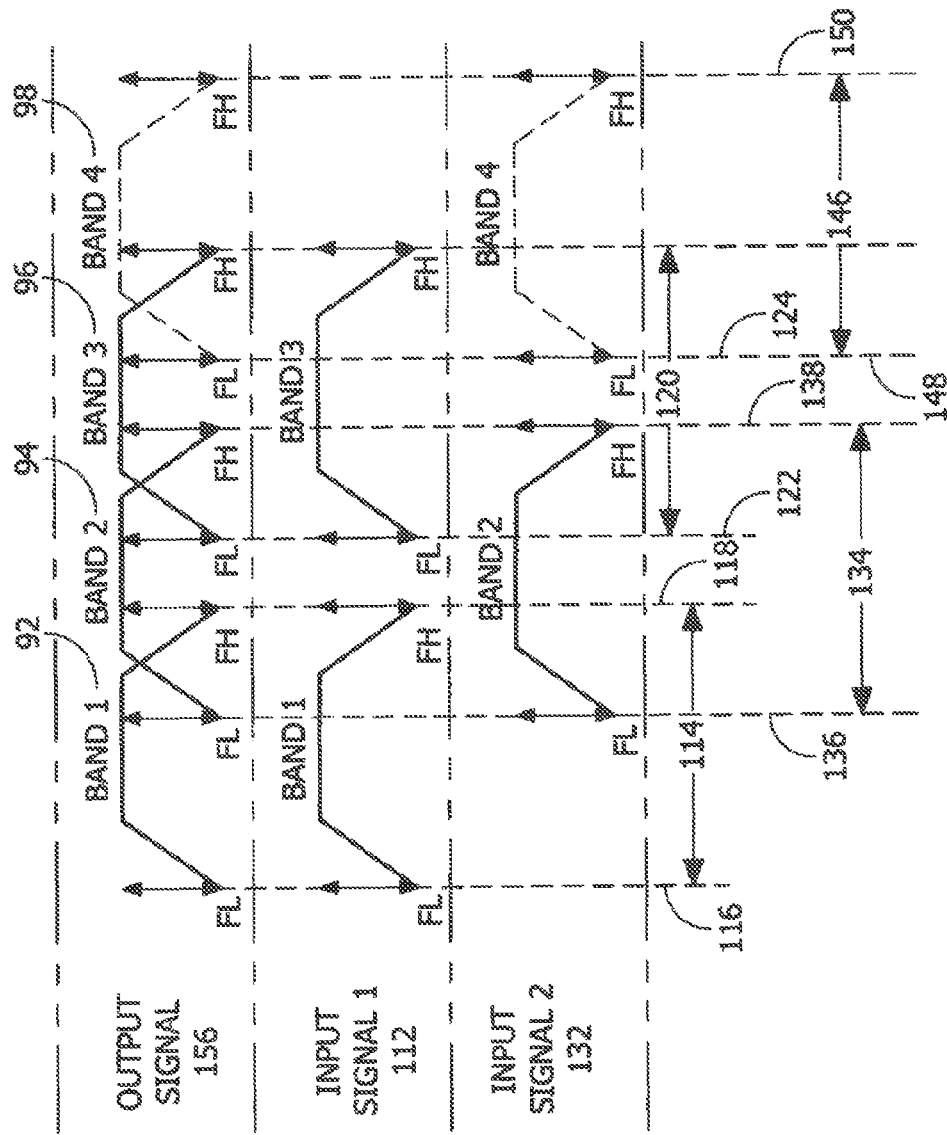
FIG. 1 is a schematic illustrating input signals having separated frequency bands, and wideband multiple output signals.

Reference will now be made in detail to the subject matter disclosed, which is illustrated in the accompanying drawings.

Referring generally to FIGS. 1 through 6, a system 100 for providing multiple output signals is described in accordance with the present disclosure. In a specific instance, the multiple output signals may be wideband Radio Frequency (RF) signals having a frequency range of between 30 megahertz (MHz) and six gigahertz (GHz). However, other ranges may be utilized as well. The system 100 may be utilized for providing three or more signals to signal receiving elements/RF paths (e.g., antennas or other independent RF devices), where each signal has one or more frequency bands in the frequency domain. For the purposes of the present disclosure, the term signal receiving element is not meant to limit the functionality of an RF path. For example, a signal receiving element/RF path may include any device which receives a signal. It will be appreciated that any such device may further transmit the signal, as in the case of an antenna, or the like. In embodiments, one or more frequency domain multiplexers may be utilized to separate the various signals into separate frequency bands. In this manner, the total number of amplifier stages needed to operate the system 100 may be less than if each individually banded signal associated with a signal receiving element/path/antenna utilized a final stage amplifier.

The system 100 may include an independent RF device, such as a first antenna 102, an amplifier, or the like. The system 100 may also include another independent RF device, such as a second antenna 102, another amplifier, or the like. In embodiments, the system 100 may further include a frequency domain multiplexer (e.g., a diplexer 108, a triplexer, or the like) having an input port 110 for receiving an input signal, such as a first RF input signal 112. The first RF input signal 112 may include RF signals in a band1 92/low band frequency range 114 including a first lower cutoff frequency 116 and a first upper cutoff frequency 118. The first RF input signal 112 may also include RF signals in a band3 96/high band frequency range 120 including a second lower cutoff frequency 122 and a second upper cutoff frequency 124. In a specific instance, the diplexer 108 may be designed with two GHz spacing.

The diplexer 108 may also have a first output port 126 connected to the first antenna 102 for supplying a signal in the low band frequency range 114 of the first RF input signal 112 to the first antenna 102. The diplexer 108 may further have a second output port 128 connected to the second antenna 102 for supplying a signal in the high band frequency range 120 of the first RF input signal 112 to the second antenna 102. For example, the input port 110 may be connected to the first output port 126 via a low pass filter or a band pass filter having the frequency range of band1 92, including the first lower cutoff frequency 116 and the first upper cutoff frequency 118, while the input port 110 may be connected to the second output port 128 via a high pass filter or a band pass filter having the frequency range of band3 96, including the second lower cutoff frequency 122 and the second upper cutoff frequency 124. It will be appreciated that while the diplexer 108 is described as separating the first RF input signal 112 into separate signals having the band1 92/low band frequency range 114 and the band3 96/high band frequency range 120, complete separation of the first RF input signal 112 may not be attainable in practice, and some signal power may leak from one output port to another output port.

The system 100 may also include another independent RF device, such as a third antenna 102, another amplifier, or the like. The third antenna 102 may receive a signal in a band2 94/mid band frequency range 134 of a second RF input signal 132. The mid band frequency range 134 may include a third lower cutoff frequency 136 and a third upper cutoff frequency 138. In embodiments, the first upper cutoff frequency 118 of the low band frequency range 114 is greater than the third lower cutoff frequency 136 of the mid band frequency range 134 and/or the second lower cutoff frequency 122 of the high band frequency range 120 is less than the third upper cutoff frequency 138 of the mid band frequency range 134 (e.g., as described in FIG. 1). In some instances, the upper cutoff frequency of the low band frequency range and the lower cutoff frequency of the high band frequency range may be spaced apart from between at least approximately 30 decibels (dB) to 50 dB from their band edges. Further, it will be appreciated that this range is provided by way of example only. For instance, the separation between frequency bands may vary with different power amplification levels in different implementations.

In some embodiments, the system 100 may further include a fourth antenna 102. The system 100 may also include a second frequency domain multiplexer (e.g., a second diplexer 142, a triplexer, or the like) having a second input port 144 for receiving an input signal, such as the second RF input signal 132. The second RF input signal 132 may include RF signals in the band2 94/mid band frequency range 134 (as previously described). The second RF input signal 132 may also include RF signals in a band4 98/fourth frequency range 146 including a fourth lower cutoff frequency 148 and a fourth upper cutoff frequency 150. The second diplexer 142 may also have a third output port 152 connected to the third antenna 102 for supplying a signal in the band2 94/mid band frequency range 134 of the second RF input signal 132 to the third antenna 102. The second diplexer 142 may further have a fourth output port 154 connected to the fourth antenna 102 for supplying a signal in the band4 98/fourth frequency range 146 of the second RF input signal 132 to the fourth antenna 102.

In embodiments, an amplified output signal 156 including each frequency band from the various power amplifiers is supplied to the signal paths/antennas 102. It should be noted that while the system 100 may be described as having one or two diplexers, and each RF signal supplied to a frequency domain multiplexer may be described as having one or two frequency bands, these specific examples are provided by way of example only, and are not meant to limit the present disclosure. Thus, it will be appreciated that each RF signal may include more than two frequency bands and may be utilized with more than two diplexers, and/or with other frequency domain multiplexers having more than two output ports. For example, in another example implementation, an RF signal having three frequency bands may be utilized with a triplexer (e.g., in combination another RF signal that has at least one overlapping frequency band). Further, additional diplexers, triplexers, and the like may be utilized with other RF signals having overlapping frequency bands.

Figure 2:
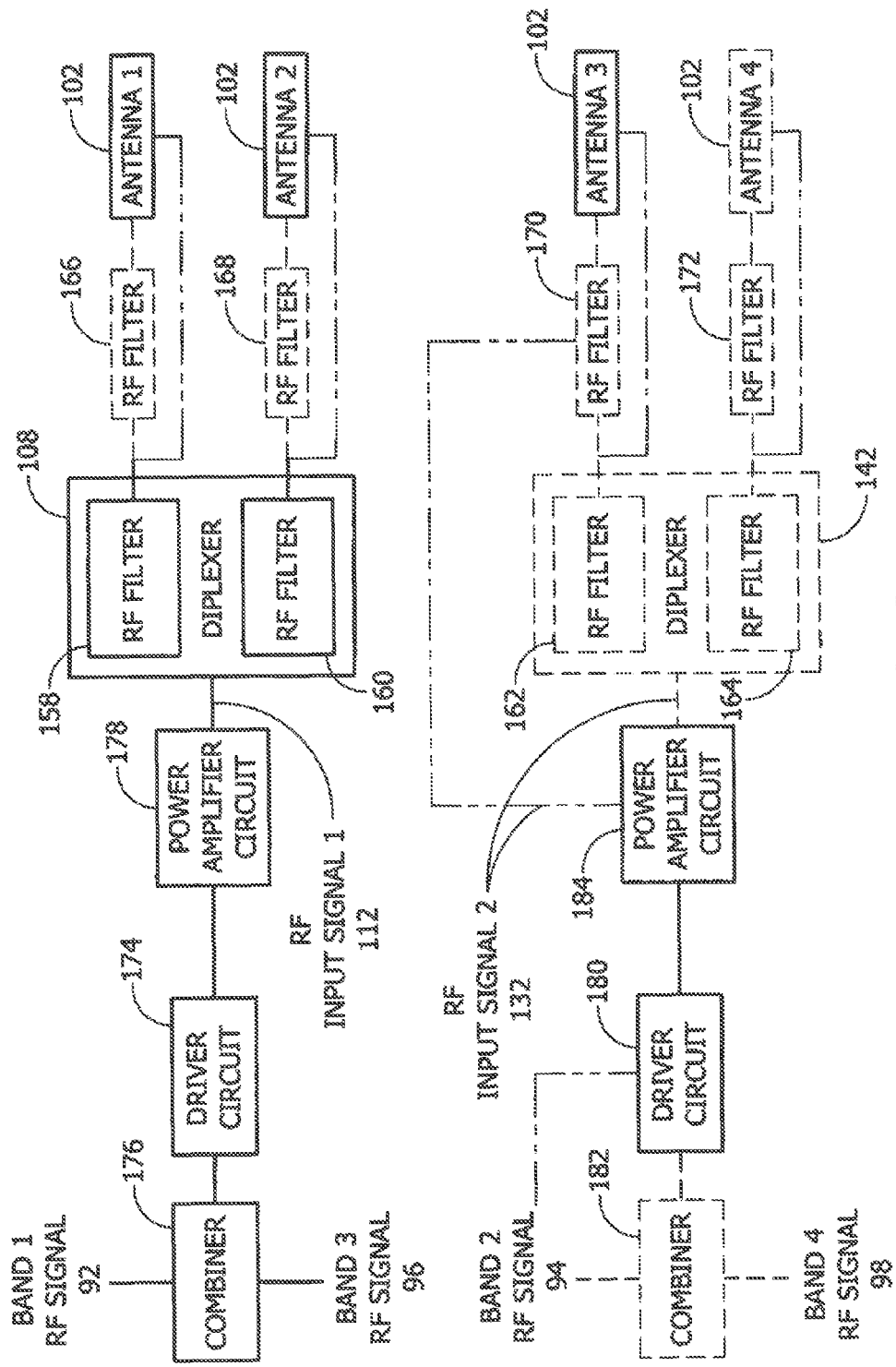
FIG. 2 is a block diagram illustrating a system for providing amplified wideband multiple output signals.
Figure 3:
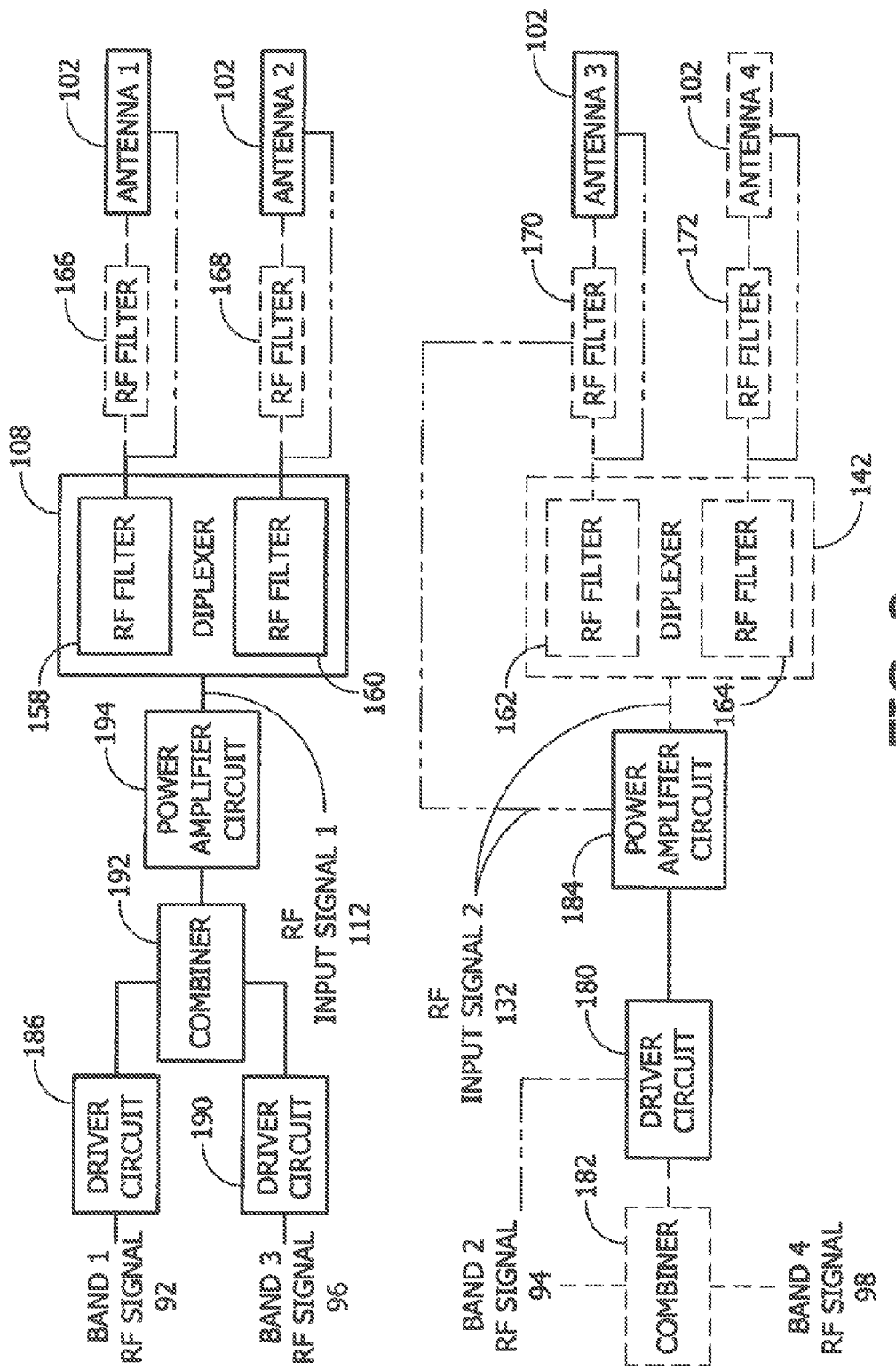
FIG. 3 is a block diagram illustrating another system for providing amplified wideband multiple output signals.
Figure 4:
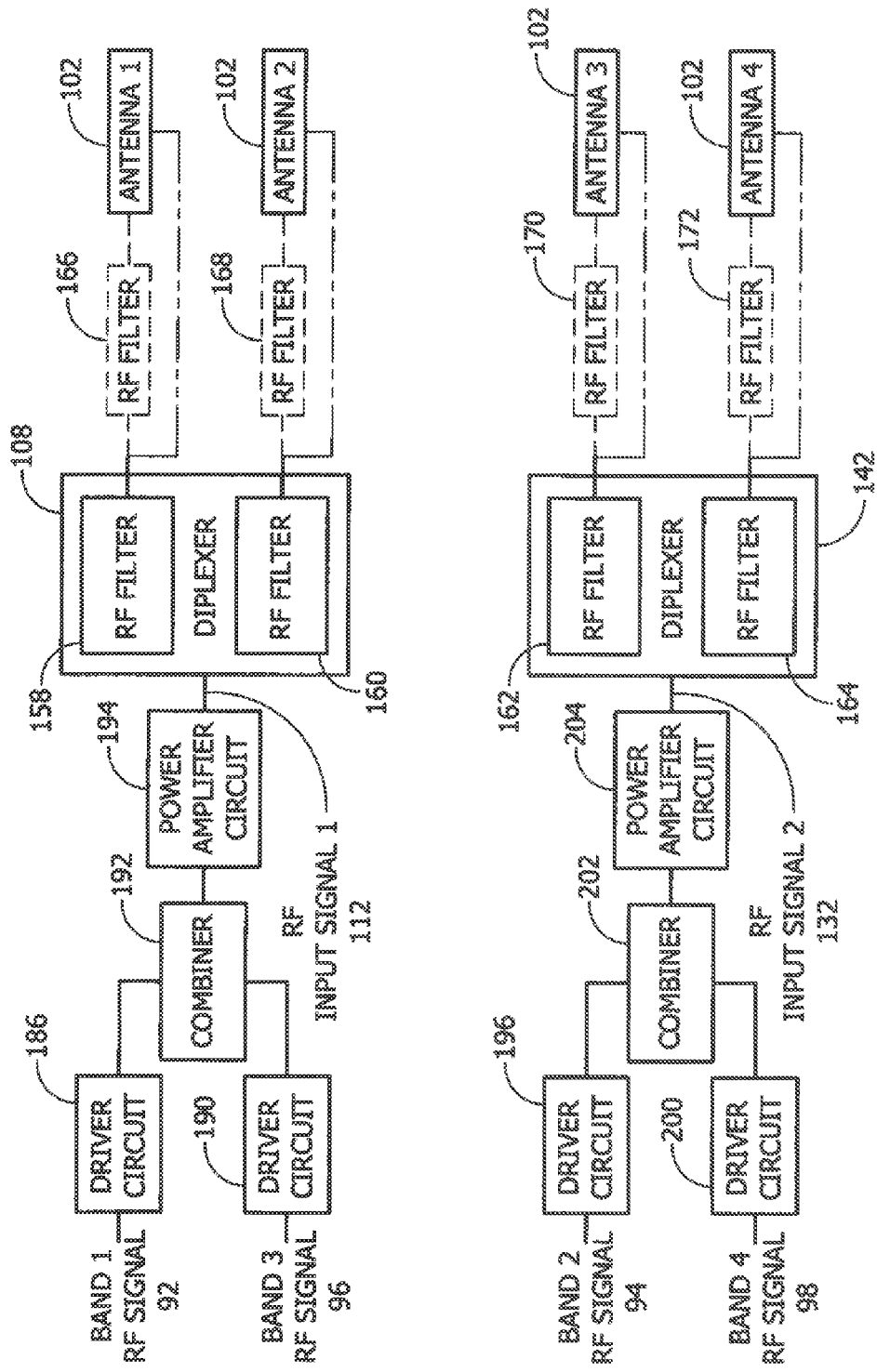
FIG. 4 is a block diagram illustrating a further system for providing amplified wideband multiple output signals.
Figure 5:
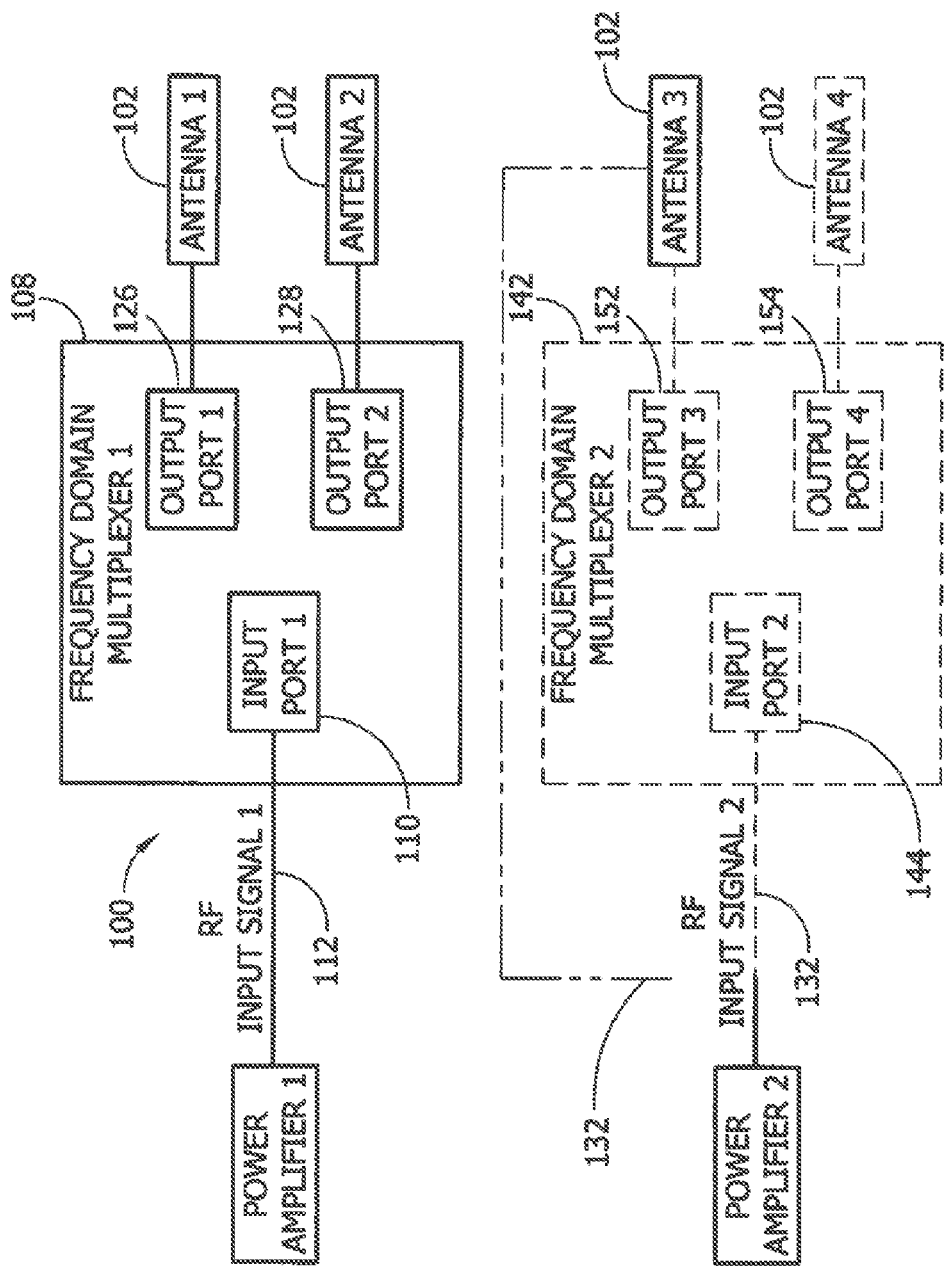
FIG. 5 is a block diagram illustrating a system for providing amplified wideband multiple output signals.

Referring now to FIGS. 2 through 4, in some embodiments, the diplexer 108 and/or the second diplexer 142 may include one or more filters, such as RF filters 158, 160, 162 and/or 164. Additionally, one or more filters, such as RF filters 166, 168, 170 and/or 172 may be included between the diplexer 108 and/or the diplexer 142 and the antennas 102. In embodiments, the RF filters 158, 160, 162, 164, 166, 168, 170, and/or 172 may include low pass filters, high pass filters, band pass filters, band reject filters, and/or harmonic filters. For example, in one specific implementation, one or more of the RF filters 166, 168, 170, and/or 172 may include harmonic filters. In another specific implementation, the RF filters 158, 160, 162, and/or 164 may include harmonic filters, and the diplexer 108 and/or the diplexer 142 may be connected directly to the antennas 102. Further, in other embodiments, the system 100 may include one or more couplers connected between the diplexer 108 and/or the diplexer 142 and the antennas 102. For example, in a still further implementation, the diplexer 108 and/or the diplexer 142 may be connected to couplers that are connected to antennas 102. The couplers may themselves be connected to RF filters that are connected to the antennas 102, such as the RF filters 166, 168, 170, and/or 172. Alternatively, the couplers may be directly connected to the antennas 102 without RF filters.

The first RF input signal 112 may be supplied by a driver circuit 174, which may be connected to a power amplifier circuit 178 (e.g., as illustrated in FIG. 2). Further, the second RF input signal 132 may be supplied by a driver circuit 180, which may be connected to a power amplifier circuit 184 (e.g., as illustrated in FIGS. 2 and 3). Alternatively, the first RF input signal 112 may be supplied by a first driver circuit 186, and also by a second driver circuit 190. The first driver circuit 186 and the second driver circuit 190 may be connected to a combiner 192, which may be connected to a power amplifier circuit 194 (e.g., as illustrated in FIGS. 3 and 4). Further, the second RF input signal 132 may be supplied by a first driver circuit 196, and also by a second driver circuit 200. The first driver circuit 196 and the second driver circuit 200 may be connected to a combiner 202, which may be connected to a power amplifier circuit 204 (e.g., as illustrated in FIG. 4).

Figure 6:
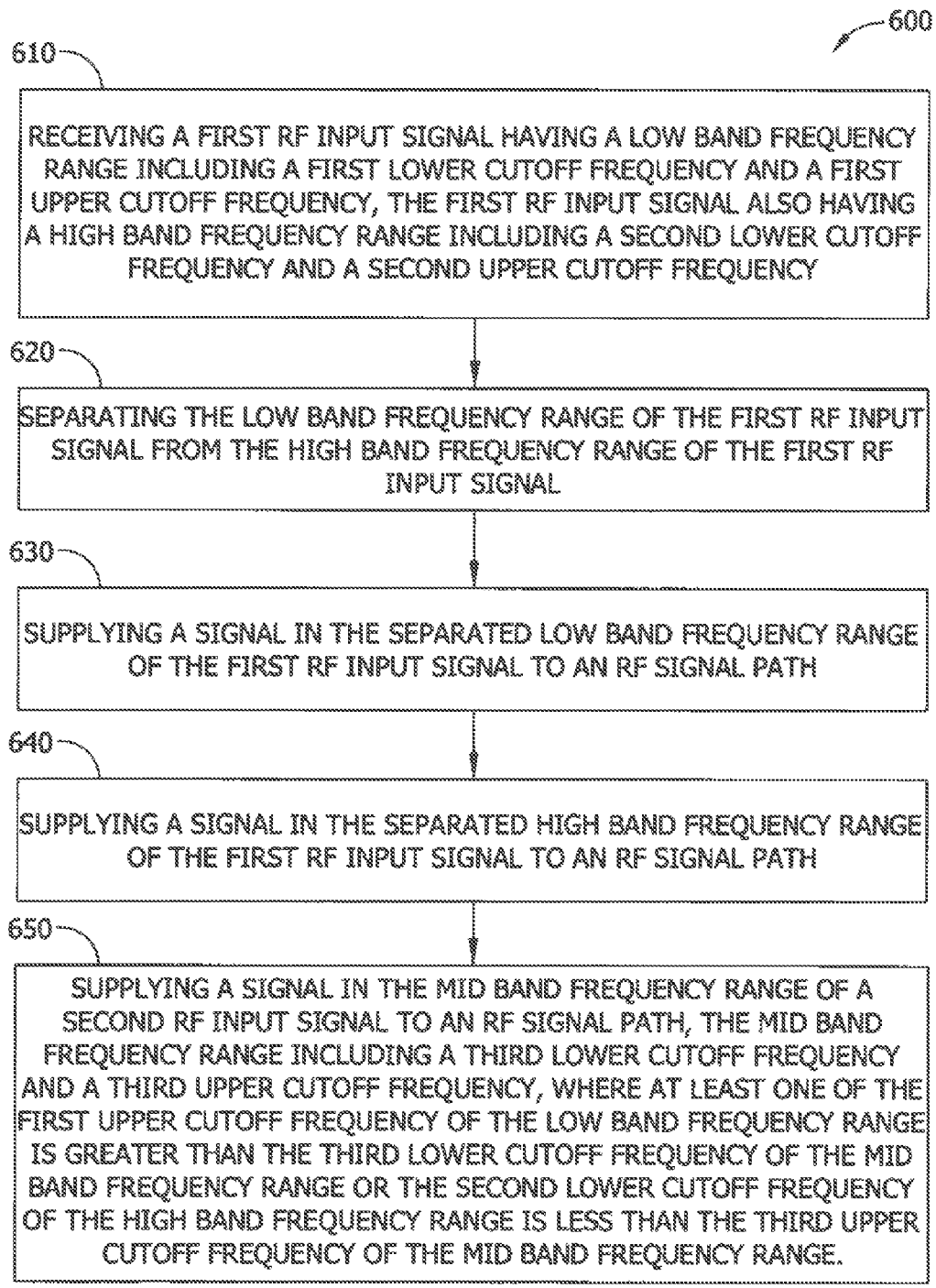
FIG. 6 is a method diagram illustrating a method for providing amplified wideband multiple output signals.

Referring now to FIG. 6, a method 600 for providing amplified multiple output signals is described in accordance with the present disclosure. The method 600 may include receiving a first input signal, 610. The first input signal may have a low band frequency range including a first lower cutoff frequency and a first upper cutoff frequency, as well as a high band frequency range including a second lower cutoff frequency and a second upper cutoff frequency. The method 600 may also include separating the low band frequency range of the first input signal from the high band frequency range of the first input signal, 620.

The method 600 may further include supplying a signal in the separated low band frequency range of the first input signal to a signal path, 630. The method 600 may also include supplying a signal in the separated high band frequency range of the first input signal to a signal path, 640. The method 600 may further include supplying a signal in a mid band frequency range of a second input signal to a signal path, 650. The mid band frequency range may include a third lower cutoff frequency and a third upper cutoff frequency. In embodiments, at least one of the first upper cutoff frequency of the low band frequency range is greater than the third lower cutoff frequency of the mid band frequency range or the second lower cutoff frequency of the high band frequency range is less than the third upper cutoff frequency of the mid band frequency range.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A device comprising:
  a first signal receiving element;
  a second signal receiving element;
  a frequency domain multiplexer including:
    an input port configured for receiving a first input signal having a low band frequency range including a first lower cutoff frequency and a first upper cutoff frequency, the first input signal also having a high band frequency range including a second lower cutoff frequency and a second upper cutoff frequency;
    a first output port connected to the first signal receiving element and configured for supplying a signal in the low band frequency range of the first input signal to the first signal receiving element, and
    a second output port connected to the second signal receiving element and configured for supplying a signal in the high band frequency range of the first input signal to the second signal receiving element; and
  a third signal receiving element configured for receiving a signal in a mid band frequency range of a second input signal, the mid band frequency range including a third lower cutoff frequency and a third upper cutoff frequency, wherein at least one of the first upper cutoff frequency of the low band frequency range is greater than the third lower cutoff frequency of the mid band frequency range or the second lower cutoff frequency of the high band frequency range is less than the third upper cutoff frequency of the mid band frequency range.

2. The device of claim 1, further comprising:
  a fourth signal receiving element; and
  a second frequency domain multiplexer having a second input port for receiving the second input signal having the mid band frequency range and a fourth frequency range including a fourth lower cutoff frequency and a fourth upper cutoff frequency, the second frequency domain multiplexer also having a third output port connected to the third signal receiving element for supplying a signal in the mid band frequency range of the second input signal to the third signal receiving element, and a fourth output port connected to the fourth signal receiving element for supplying a signal in the fourth frequency range of the second input signal to the fourth signal receiving element.

3. The device of claim 1, wherein the frequency domain multiplexer comprises at least one of a diplexer or a triplexer.

4. The device of claim 1, wherein the frequency domain multiplexer includes at least one of a low pass filter, a high pass filter, a band pass filter, a band reject filter, or a harmonic filter.

5. The device of claim 1, further comprising at least one of a low pass filter, a high pass filter, a band pass filter, a band reject filter, or a harmonic filter disposed between at least one of the first output port and the first antenna, the second output port and the second antenna, or the third output port and the third antenna.

6. A method for providing amplified multiple output signals, comprising:
   receiving a first input signal having a low band frequency range including a first lower cutoff frequency and a first upper cutoff frequency, the first input signal also having a high band frequency range including a second lower cutoff frequency and a second upper cutoff frequency;
   separating the low band frequency range of the first input signal from the high band frequency range of the first input signal;
   supplying a signal in the separated low band frequency range of the first input signal to a signal path;
   supplying a signal in the separated high band frequency range of the first input signal to a signal path; and
   supplying a signal in a mid band frequency range of a second input signal to a signal path, the mid band frequency range including a third lower cutoff frequency and a third upper cutoff frequency, where at least one of the first upper cutoff frequency of the low band frequency range is greater than the third lower cutoff frequency of the mid band frequency range or the second lower cutoff frequency of the high band frequency range is less than the third upper cutoff frequency of the mid band frequency range.

7. The method of claim 6, further comprising:
   separating the mid band frequency range of the second input signal from a fourth frequency range of the second input signal, the fourth frequency range including a fourth lower cutoff frequency and a fourth upper cutoff frequency; and
   supplying a signal in the separated fourth frequency range of the second input signal to a signal path.

8. The method of claim 6, wherein separating the low band frequency range of the first input signal from the high band frequency range of the first input signal comprises:
   utilizing a frequency domain multiplexer to separate the low band frequency range of the first input signal from the high band frequency range of the first input signal.

9. The method of claim 8, wherein the frequency domain multiplexer comprises at least one of a diplexer or a triplexer.

10. The method of claim 8, wherein the frequency domain multiplexer includes at least one of a low pass filter, a high pass filter, a band pass filter, a band reject filter, or a harmonic filter.

11. The method of claim 8, further comprising:
   supplying at least one of the separated low band frequency range of the first signal or the separated high band frequency range of the first signal to a signal path utilizing a Radio Frequency (RF) filter connected between the frequency domain multiplexer and the signal path.

12. The method of claim 11, wherein the RF filter includes at least one of a low pass filter, a high pass filter, a band pass filter, a band reject filter, or a harmonic filter.

13. A system comprising:
   a first signal receiving element;
   a second signal receiving element;
   a frequency domain multiplexer including:
      an input port configured for receiving a first input signal having a low band frequency range including a first lower cutoff frequency and a first upper cutoff frequency, the first input signal also having a high band frequency range including a second lower cutoff frequency and a second upper cutoff frequency;
      a first output port connected to the first signal receiving element and configured for supplying a signal in the low band frequency range of the first input signal to the first signal receiving element, and
      a second output port connected to the second signal receiving element and configured for supplying a signal in the high band frequency range of the first input signal to the second signal receiving element;
   a first amplifier for providing the first signal to the frequency domain multiplexer;
   a third signal receiving element configured for receiving a signal in a mid band frequency range of a second input signal, the mid band frequency range including a third lower cutoff frequency and a third upper cutoff frequency, wherein at least one of the first upper cutoff frequency of the low band frequency range is greater than the third lower cutoff frequency of the mid band frequency range or the second lower cutoff frequency of the high band frequency range is less than the third upper cutoff frequency of the mid band frequency range; and
   a second amplifier for providing the second signal to the third signal receiving element.

14. The system of claim 13, further comprising:
   a fourth signal receiving element; and
   a second frequency domain multiplexer having a second input port for receiving the second input signal having the mid band frequency range and a fourth frequency range including a fourth lower cutoff frequency and a fourth upper cutoff frequency, the second frequency domain multiplexer also having a third output port connected to the third signal receiving element for supplying a signal in the mid band frequency range of the second input signal to the third signal receiving element, and a fourth output port connected to the fourth signal receiving element for supplying a signal in the fourth frequency range of the second input signal to the fourth signal receiving element.

15. The system of claim 13, wherein the frequency domain multiplexer comprises at least one of a diplexer or a triplexer.

16. The system of claim 13, wherein the frequency domain multiplexer includes at least one of a low pass filter, a high pass filter, a band pass filter, a band reject filter, or a harmonic filter.

17. The system of claim 13, further comprising at least one of a low pass filter, a high pass filter, a band pass filter, a band reject filter, or a harmonic filter disposed between at least one of the first output port and the first antenna, the second output port and the second antenna, or the third output port and the third antenna.

18. The device of claim 1, wherein the upper cutoff frequency of the low band frequency range and the lower cutoff frequency of the high band frequency range are spaced apart from between at least approximately 30 decibels (dB) to 50 dB.

19. The method of claim 6, wherein the upper cutoff frequency of the low band frequency range and the lower cutoff frequency of the high band frequency range are spaced apart from between at least approximately 30 decibels (dB) to 50 dB.

20. The system of claim 13, wherein the upper cutoff frequency of the low band frequency range and the lower cutoff frequency of the high band frequency range are spaced apart from between at least approximately 30 decibels (dB) to 50 dB.

* * * * *